(12) United States Patent
Goldbach et al.

(10) Patent No.: US 7,825,013 B2
(45) Date of Patent: Nov. 2, 2010

(54) INTEGRATED CIRCUIT COMPRISING AN AMORPHOUS REGION AND METHOD OF MANUFACTURING AN INTEGRATED CIRCUIT

(75) Inventors: Matthias Goldbach, Dresden (DE); Dietmar Henke, Radebeul (DE); Sven Schmidbauer, Dresden (DE)

(73) Assignee: Qimonda AG, Munich (DE)

( * ) Notice: Subject to any disclaimer, the term of this patent is extended or adjusted under 35 U.S.C. 154(b) by 201 days.

(21) Appl. No.: 12/122,892

(22) Filed: May 19, 2008

(65) Prior Publication Data
US 2008/0283832 A1 Nov. 20, 2008

Related U.S. Application Data

(63) Continuation-in-part of application No. 11/602,066, filed on Nov. 20, 2006.

(51) Int. Cl.
*H01L 21/20* (2006.01)
*H01L 29/04* (2006.01)
*H01L 31/20* (2006.01)

(52) U.S. Cl. .............................. 438/482; 257/52; 257/61
(58) Field of Classification Search ......... 438/533–534, 438/682, 684; 257/52, 61, E29.122, E29.299, 257/E21.431, E21.619
See application file for complete search history.

(56) References Cited

U.S. PATENT DOCUMENTS

| 6,900,854 | B1 * | 5/2005 | Kim et al. ...................... 349/43 |
| 7,083,900 | B2 * | 8/2006 | Bae .............................. 430/319 |
| 7,433,009 | B2 * | 10/2008 | Kuo ............................ 349/152 |
| 7,491,971 | B2 * | 2/2009 | Nakamura .................... 257/59 |

* cited by examiner

*Primary Examiner*—Calvin Lee
(74) *Attorney, Agent, or Firm*—Fay Kaplun & Marcin, LLP (57) ABSTRACT

An integrated circuit comprises a doped semiconductor portion including an amorphous portion and a contact structure comprising a conductive material. The contact structure is in contact with the amorphous portion. According to another embodiment, an integrated circuit comprises a doped semiconductor portion including a region having a non-stoichiometric composition and a contact structure comprising a conductive material. The contact structure is in contact with the region having a non-stoichiometric composition.

20 Claims, 7 Drawing Sheets

INTEGRATED CIRCUIT COMPRISING AN AMORPHOUS REGION AND METHOD OF MANUFACTURING AN INTEGRATED CIRCUIT

PRIORITY CLAIM

This application is a Continuation-In-Part application of U.S. patent application Ser. No. 11/602,066 filed on Nov. 20, 2006 entitled "Method for Manufacturing A Semiconductor Device". The entire disclosure of the prior application are considered as being part of the disclosure of the accompanying application and hereby expressly incorporated by reference herein.

BACKGROUND

The present specification relates to an integrated circuit comprising an amorphous region as well as to a method for forming such an integrated circuit. For example, a contact may be made so as to be adjacent to the amorphous region.

In the field of semiconductor technology the issue of contact resistance, i.e. the resistance of a metal (compound) to semiconductor contact is gaining rising interest. In particular, due to the further miniaturization of integrated circuits, the further reduction of the contact resistance, for example of ohmic or Schottky contacts is investigated. Hence, there is a need to further improve the interface between semiconductor and metal material.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. Is to be understood that other embodiments may be utilized and structural or logical changes may be made without departing from the scope defined by the claims.

Figure 1A:
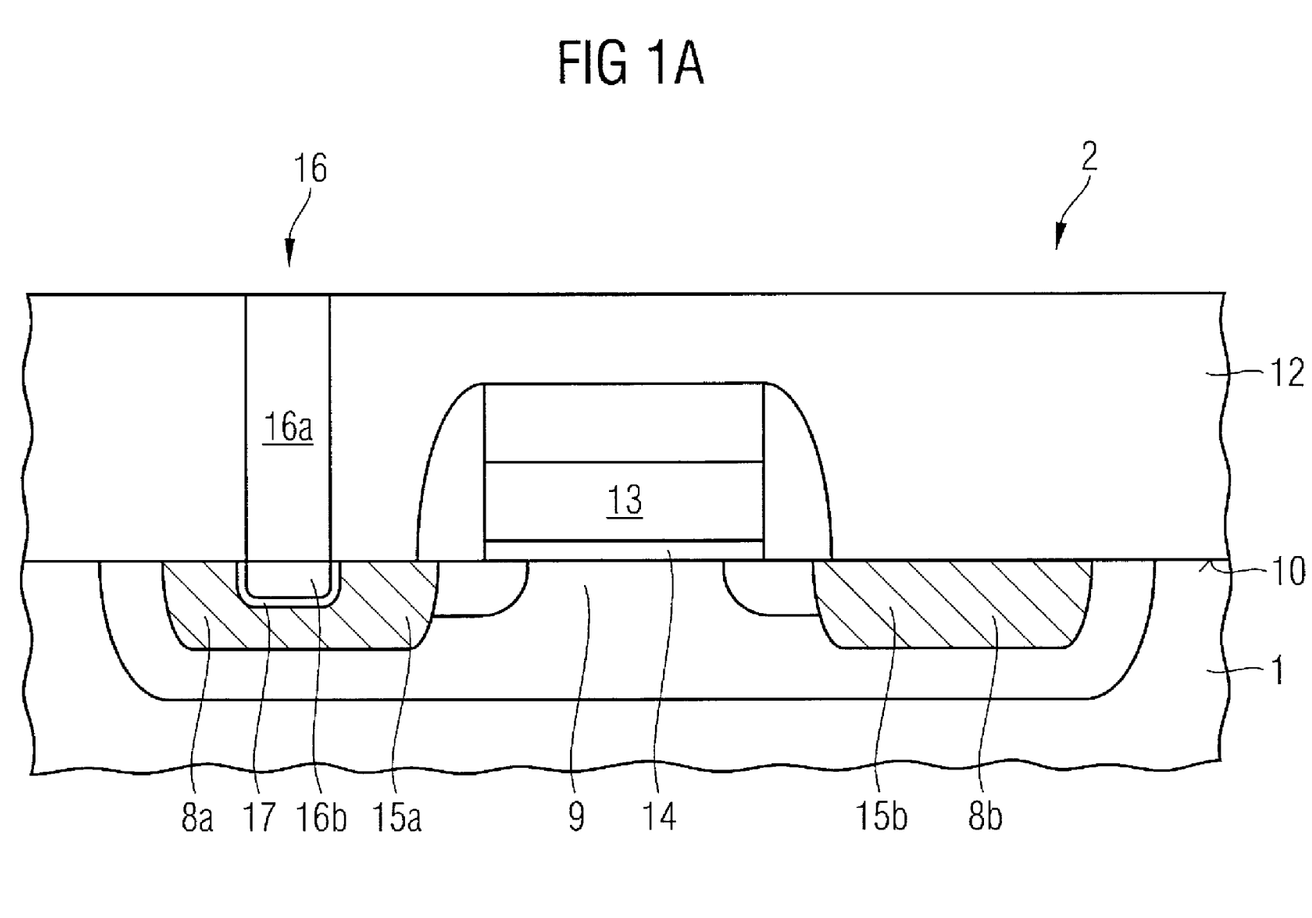
FIGS. 1A and 1B show cross sectional views of an integrated circuit according to an embodiment.

FIG. 1A shows a cross sectional view of an integrated circuit according to an embodiment. The integrated circuit shown in FIG. 1A comprises a transistor 2. The transistor 2 comprises a first and a second source drain portions 15a, 15b that are formed in a semiconductor substrate 1. The terms "wafer", "substrate", "semiconductor chip" or "semiconductor substrate" used in the context of the present description may include any semiconductor-based structure that has a semiconductor substrate. Wafer and substrate are to be understood to include silicon, silicon-on-insulator (SOI), silicon-on-sapphire (SOS), doped and undoped semiconductors, epitaxial layers of silicon supported by a base crystalline material, and other semiconductor structures. The semiconductor need not be silicon-based. The semiconductor could as well be, among others, silicon-germanium, germanium or gallium arsenide. Various components may already be formed in the substrate. Moreover, different layers may be embedded in the substrate material.

A channel region 9 is disposed between the first and the second source drain portions 15a, 15b. The gate electrode 13 is disposed adjacent to the substrate surface 10. The gate electrode 13 is insulated from the channel region 9 by a gate dielectric 14. A contact plug 16 is disposed adjacent to the first source drain portion 15a. The contact plug 16 comprises a metal portion 16a. Further, a metal silicide portion 16b is disposed between the metal portion 16a and the doped portion 15a. Moreover, an amorphous region or a region with a non-stoichiometric composition 17 is formed between the metal silicide portion 16b and the source drain portion 15a. Accordingly, the transistor 2 comprises a first and a second source drain portions 15a, 15b and a channel region 9. At least one of the first and second source drain portions 15a, 15b comprises an amorphous region. For example, the amorphous region 17 is disposed in the first source/drain portion 15a.

According to an embodiment, at least one of the first and second source drain portions 15a, 15b may further comprise a monocrystalline portion 8a. For example, in FIG. 1A the monocrystalline portion 8a is disposed in those portions of the first source/drain portion 15a, that are neither the amorphous region 17 nor the metal silicide portion 16b. According to a further embodiment, instead of an amorphous region, the region 17 may be a region with a non-stoichiometric composition.

As is shown in FIG. 1A, the monocrystalline portion 8a is disposed at an interface between the source drain portion 15a and the substrate portion 1. The integrated circuit shown in FIG. 1A further comprises a contact structure 16. The contact structure 16 comprises a conductive material 16a. The contact structure is in contact with the amorphous portion 17. To be more specific, the contact structure 16 comprises a metal silicide 16b that is in contact with the amorphous portion 17. A dielectric material 12, for example comprising silicon oxide, silicon nitride, (boron) phosphorous silicate glass, spin-on dielectric (glass) may be disposed over the substrate surface 10.

Figure 1B:
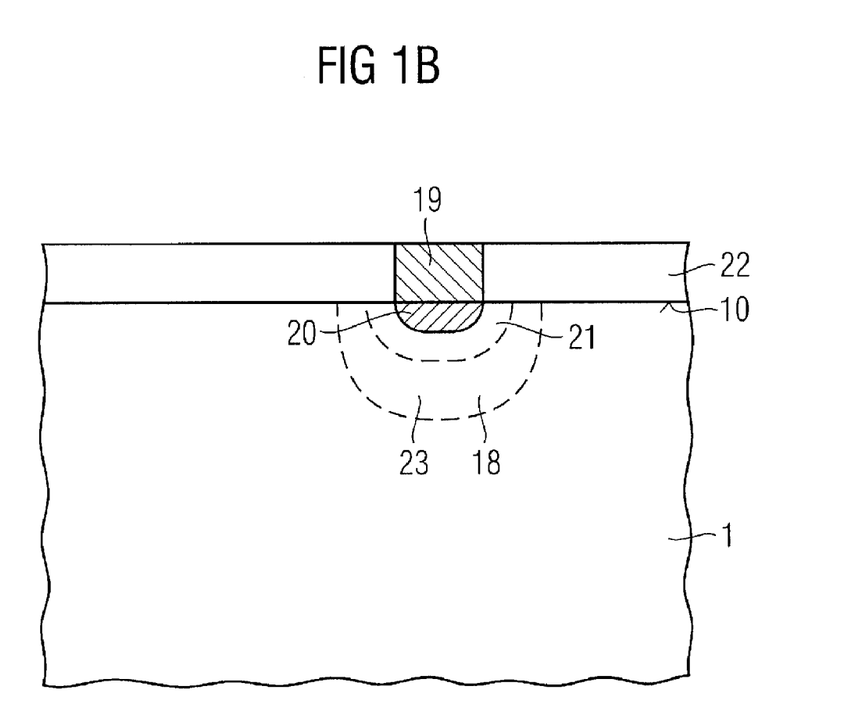

According to another embodiment, as is shown in FIG. 1B, an integrated circuit comprises a doped semiconductor portion 18 including an amorphous portion 21 and a contact structure 19 comprising a conductive material. The contact structure 19 comprises a conductive material and a metal silicide portion 20. The metal silicide portion 20 is in contact with the amorphous portion 21. Also according to this embodiment, the amorphous portion 21 may be replaced by a portion having a non-stoichiometric composition.

In the embodiment shown in FIG. 1B, the contact structure comprises a metal-silicide 20 that is in contact with the amorphous portion 21. Moreover, the doped semiconductor portion 18 may further comprise a monocrystalline portion 23. The doped semiconductor portion may form part of a semiconductor carrier. For example, the semiconductor carrier may be a semiconductor substrate 1 having a surface 10. Nevertheless, the doped semiconductor portion may as well be any kind of connection structure or other component of a semiconductor device. Accordingly, the doped semiconductor portion may as well be a part of a gate electrode or of any other functional device. The material of the doped semiconductor portion need not necessarily be monocrystalline but may as well be polycrystalline or may be in any other suitable configuration.

According to an embodiment, the monocrystalline portion may be disposed at an interface between the doped portion 18 and the semiconductor carrier 1.

In FIGS. 1A and 1B the portions 17 and 21 refer to an amorphous portion or a portion with a non-stoichiometric composition. According to a first explanation, there may be a plurality of interfacial traps that may facilitate a current transport across the Schottky barrier which may be present at the interface of semiconductor and metallic material. According to another explanation, due to the amorphization or non-stoichiometric composition the crystalline structure of the semiconductor material is largely destroyed in this interfacial region so that a contact resistance is largely reduced. A disturbance or destruction of the band structure may be caused by performing the ion implantation step. According to another interpretation, this disturbance or destruction may be caused by ions being present in a non-stoichiometric ratio. Accordingly, any of the methods comprising ion implantation, bombarding with ions and introducing additives such as a doping material may equally result in a disturbance of the crystalline structure or the introduction of carrier traps. As a result, the contact resistance is largely reduced.

Figure 2A:
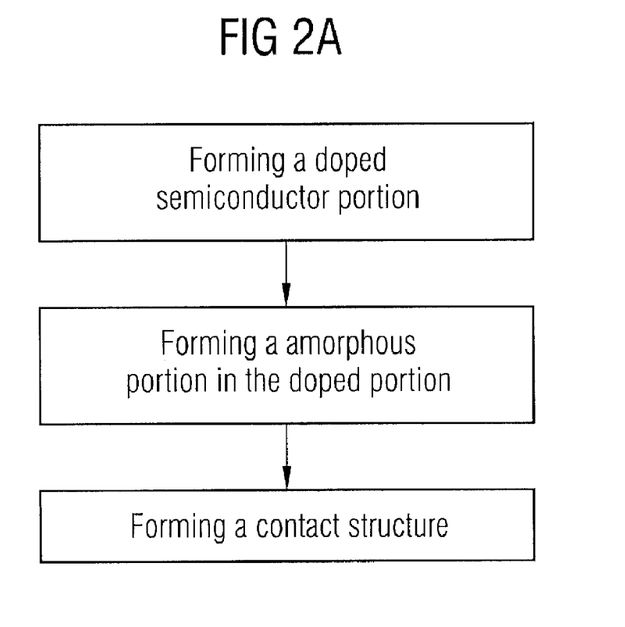
FIGS. 2A and 2B show exemplary flow charts of the method according to an embodiment.

In the following, a method of forming an integrated circuit will be explained. As is shown in FIG. 2A, a method of forming an integrated circuit may comprise forming a doped semiconductor portion and thereafter, forming an amorphous portion in the doped portion. Thereafter, a contact structure may be formed so as to be in contact with the amorphous portion.

Figure 2B:
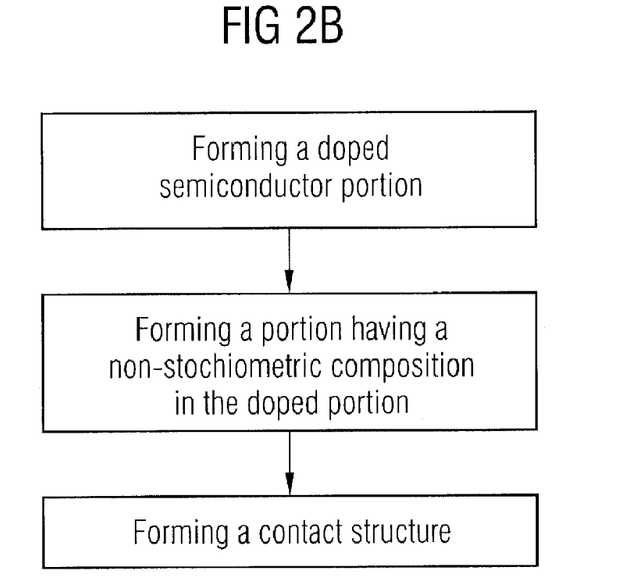

According to another embodiment, as is shown in FIG. 2B, forming an integrated circuit may comprise forming a doped semiconductor portion, followed by forming a portion having a non-stoichiometric composition in the doped portion, followed by forming a contact structure.

According to further embodiments, the contact structure may be formed before forming the amorphous portion or the portion having a non-stoichiometric composition. For example, the amorphous portion or the portion having a non-stoichiometric composition may be formed by performing an ion implantation process. For example, the ion implantation process may comprise implanting ions having an atomic number higher than 5, for example, higher than 8. By way of example, the ion implantation may be performed using a gaseous species such as Kr, Ar, F. Moreover, this species may be selected so that the ions have a low solubility in the substrate material. Accordingly, these ions might evaporate after performing the amorphization or non-stoichiometric composition generation process. According to another approach, these ions might be taken of group IV of the periodic table. Examples include C, Si, Sn, Pb and Ge. Accordingly, no doping effect might occur. According to still another approach, the ion implantation may be performed so that a doping as well as the amorphization process or the non-stoichiometric composition generation may occur. Further examples of the implantation species includes clusters and carbon containing molecules.

For example, the ion implantation process may be performed in such a manner that a monocrystalline portion remains at an interface between the doped portion and the semiconductor carrier.

In the following, an exemplary process flow for obtaining an integrated circuit according to an embodiment will be described.

Figure 3A:
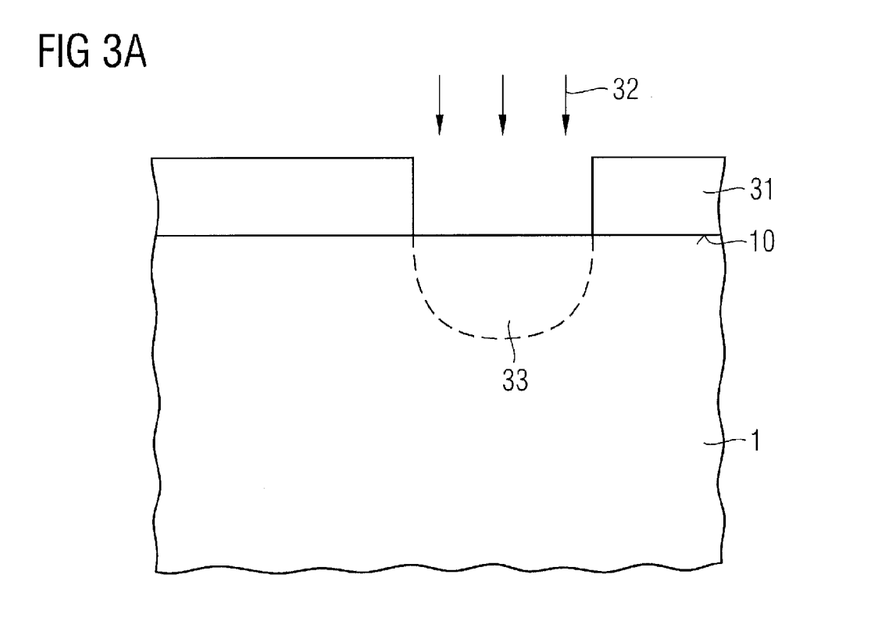
FIG. 3A to 3C illustrates a method of forming an integrated circuit according to an embodiment.

As is shown in FIG. 3A, an arbitrary mask 31 may be formed on the surface 10 of a semiconductor substrate 1. For example, the mask 31 may comprise any of the generally known masks including hardmasks, photomasks and others. A contact opening is formed in the mask 31. First, an ion implantation step 32 may be performed so as to define a doped portion 33. For example, the doped portion 33 may be a source/drain portion forming part of a transistor that may be used in a DRAM memory cell. Nevertheless, as is clearly to be understood, the transistor may be any arbitrary transistor. For example, the mask 31 may as well comprise elements of the integrated circuit to be formed. For example, if a transistor is to be formed, the mask 31 may comprise a gate electrode of the completed transistor or other elements. Moreover, as is clearly to be understood, the doped portion 33 may as well be formed without using a masking material 31, for example, by a blanket ion implantation process.

After performing the ion implantation step, remaining portions of the mask 31 may be removed. Thereafter, a further mask may be formed over the surface 10 of the substrate. For example, the mask may comprise a dielectric layer 34 or any other material. A contact opening 35 may be defined in the dielectric layer 34. Thereafter annealing steps may be performed which may be useful for improving the characteristics of the resulting transistors. According to a modification, annealing steps may also be performed before the deposition of the dielectric layer 34.

Figure 3B:
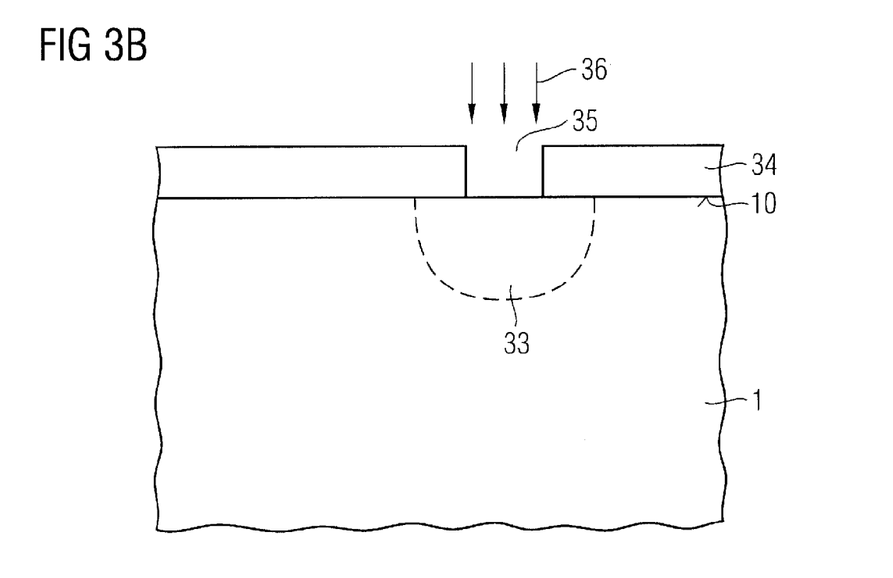

After defining the contact opening 35, an additional ion implantation step 36 may be performed so as to form an amorphous region in the doped portion 33. Alternatively, a region having a non-stoichiometric composition may be formed. For example, this ion implantation may be performed using Be, Kr, Ar, Sn, C, F, Si ions and others. As an example, the energy of the ion implantation may be in the range of 2 to 10 keV for Ge ions. Moreover, a dose of the ions may be 1E13 to 1E15 $cm^2$ for Ge– Ions. The parameters of the ion implantation may be selected in such a manner that no defects in the depletion region of the pn junction between the doped portion 33 and the substrate may be generated. Accordingly, these parameters have to be selected in accordance with the mass of the ions taken.

Figure 3C:
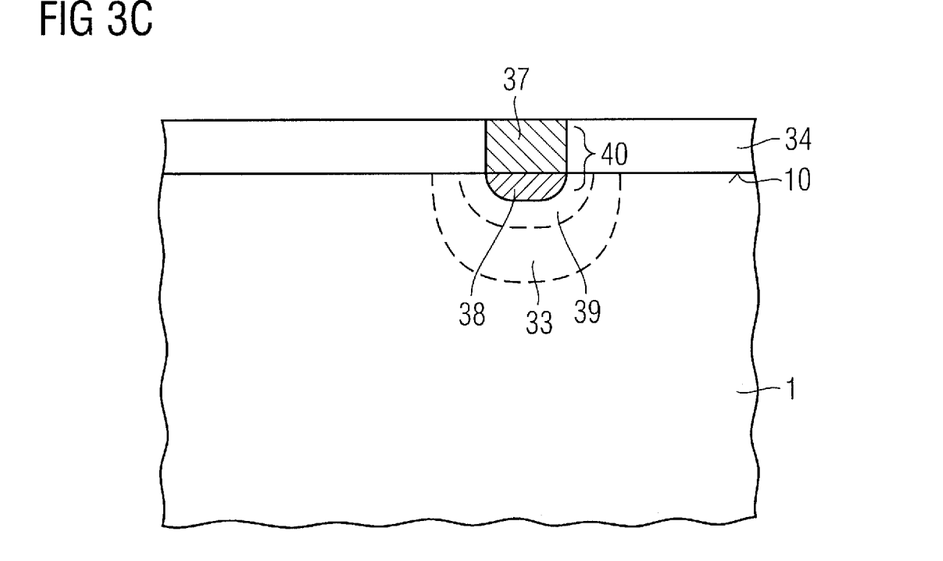

Thereafter, the metal may be provided in the contact opening 35 so as to form a contact. Due to the reaction of the metal with the silicon material, the contact may comprise a metallic portion 37 and a silicide portion 38 that comprises a metal silicide. For example, any suitable metal or metal composition may be used as the metal for the contact. Examples comprise Ni, Co, Ti, Pt, Yb, Er, Pd, Re and combinations of any of these materials. Moreover, any composition comprising any of these metals may be used. The conductive material may be provided using a generally known deposition process, including chemical vapour deposition (CVD), physical vapour deposition (PVD), metalorganic chemical vapour deposition (MOCVD), atomic layer deposition (ALD) and others. According to an embodiment, for forming the contact plug 40, first, a liner comprising a metal may be formed, followed by a conductive filling. For example, first, a TiN liner may be formed, followed by a tungsten filling. The TiN liner forms TiSi at the interface of the silicon substrate material.

According to embodiments of the invention, the succession of the deposition step of the dielectric layer 34 and annealing step may be changed in any arbitrary manner. For example, if the contact opening 35 is formed after the annealing step, problems occurring when the dielectric layer 34 may flow or partially melt may be avoided. According to the process flow, the amorphous portion 39 may be formed after any of the annealing steps or high temperature steps. In the context of this specification the term "high temperature" refers to a temperature of above 620°. Accordingly, a re-crystallization of the amorphous portion due to the high temperatures may be avoided.

Figure 4A:
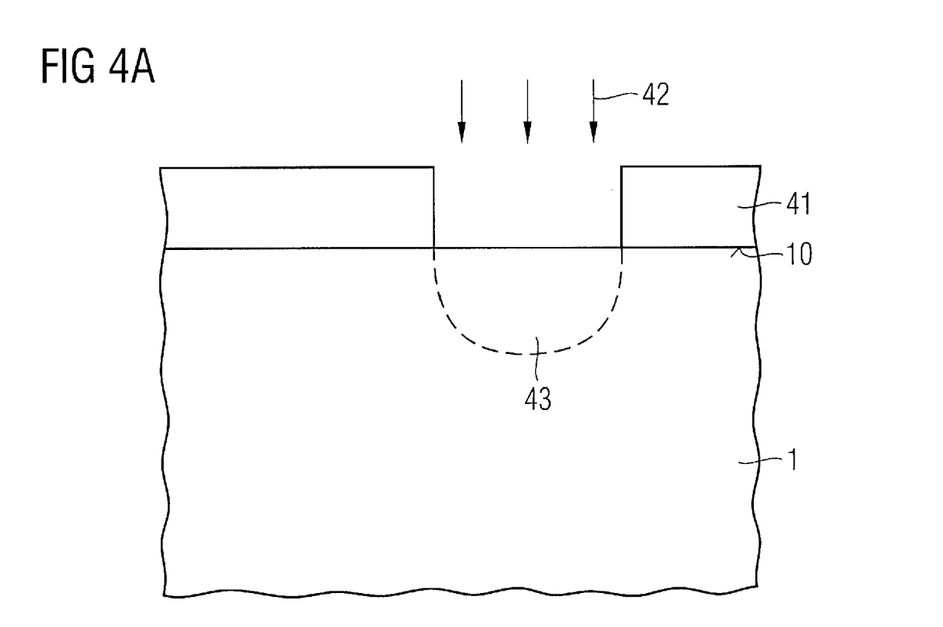
FIG. 4A to 4C illustrate cross sectional views of a substrate when performing the method according to an embodiment.
Figure 4B:
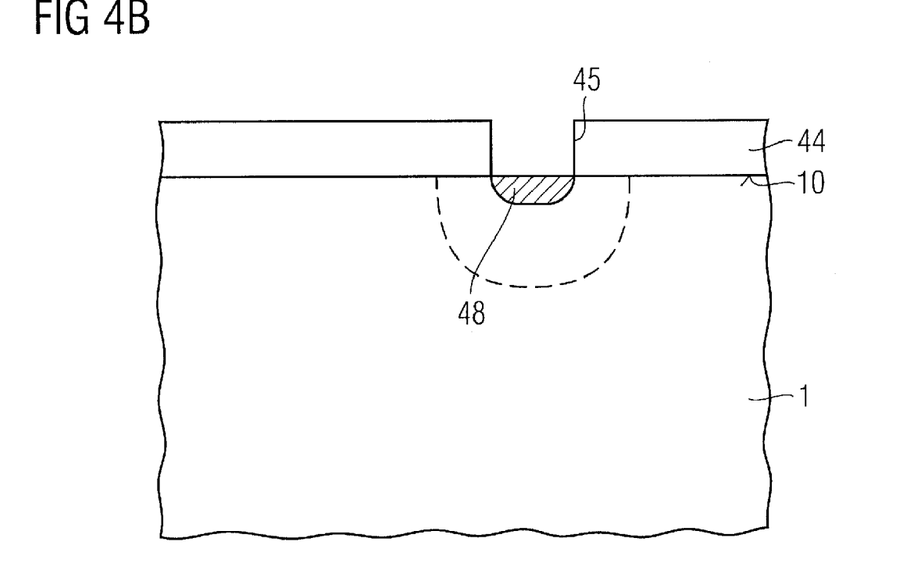
Figure 4C:
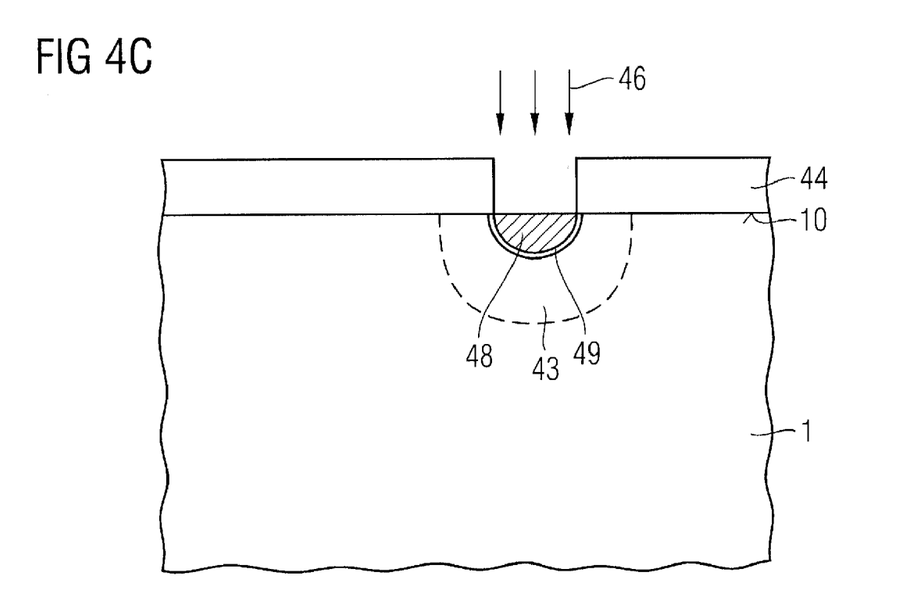

According to another embodiment, as will be explained here in below with reference to FIG. 4A to 4C, the amorphization step may as well be performed after forming the contact structure. Accordingly, as is shown in FIG. 4A, a suitable mask 41 may be formed over the surface 10 of a semiconductor substrate 1. An opening for defining a doped portion 43 is defined in the mask 41. The mask 41 may be implemented in the same manner as the mask 31 of the embodiment of FIG. 3A to 3C. First, an ion implantation step 42 is performed so as to provide the doped region 43. After performing the ion implantation step, a further mask 44 may be formed over the surface 10 of the semiconductor substrate 1. For example, the mask 44 may comprise the dielectric layer as is generally known in the art. The dielectric layer 44 may comprise silicon-oxide, silicon-nitride, boron silicate glass, boron phosphorous silicate glass, spin-on dielectric, spin-on glass and any other suitable materials and combinations thereof. A contact opening 45 is defined in the dielectric layer 44. A first portion of the conductive material 47 may be filled in the contact opening 45. The conductive material may comprise any of the conductive materials as has been explained above with reference to FIG. 3C. Accordingly, a metal silicide portion 48 may be formed adjacent to the substrate portion. Thereafter, as is shown in FIG. 4c, an ion implantation step 46 may be performed so as to form the amorphous region 49 or the region having a non-stoichiometric composition. The ion implantation step may be performed with any of the ions as has been explained above with reference to FIG. 3B. Then, the contact plug will be further processed by filling additional conductive material 47 in the contact opening 45.

Figure 5A:
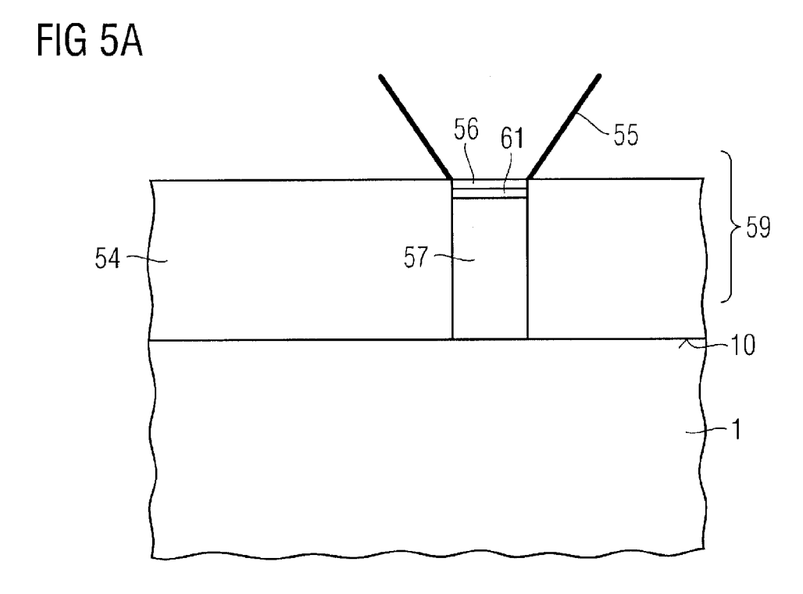
FIGS. 5A and 5B, respectively, illustrate further cross-sectional views of an integrated circuit according to an embodiment.

The integrated circuit according to embodiments of the present invention may comprise, for example, a transistor. Moreover, the integrated circuit may comprise any component or device comprising a contact between a semiconductor material and a metallic portion. In the context of the present specification the term "metallic component" refers to a structure comprising a metal or a metal compound. Examples of the structure comprise conductive plugs, conductive lines, electrodes and others. For example, as is shown in FIG. 5A, the element comprising a metal may be a capacitor electrode 55 of a storage capacitor. The contact between a contact plug 57 that may, for example, comprise polysilicon and the capacitor electrode 55 comprises an amorphous portion 61 or a portion having a non-stoichiometric composition as well as a metal silicide portion 56. Accordingly, the integrated circuit may comprise a capacitor contact 59 that establishes a contact between the silicon material and a capacitor electrode 55.

Figure 5B:
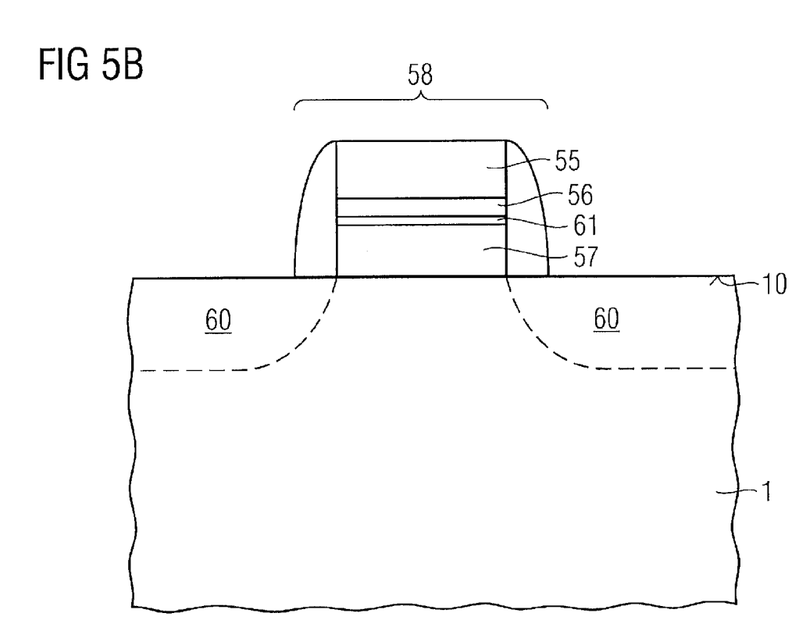

As is shown in FIG. 5B, the integrated circuit may as well comprise a gate electrode 58. The gate electrode 58 comprises a polysilicon material 57 and a metal portion 55. At the interface between the metal portion 55 and the polysilicon portion 57, a metal silicide 56 is formed as well as an amorphous portion 61. The amorphous portion 61 is disposed between the metal silicide portion 56 and the polysilicon material 57. The transistor shown in FIG. 5B further comprises first and second source/drain portions 60. As is clearly to be understood, any of the contacts of the source/drain portions 60 may be formed in a manner as has been explained above with reference to FIG. 1a, for example.

The embodiments of the invention described in the foregoing description are examples given by way of illustration and the invention is nowise limited thereto. Any modification, variation and equivalent arrangement should be considered as being included within the scope of the invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming an integrated circuit comprising forming a doped semiconductor portion;
   forming an amorphous portion in the doped semiconductor portion; and
   forming a contact structure comprising a conductive material, so as to be in contact with the amorphous portion.

2. The method of claim 1, wherein forming the contact structure comprises forming a metal silicide that is in contact with the amorphous portion.

3. The method of claim 1, wherein forming the amorphous portion comprises performing an ion implantation process.

4. The method of claim 3, wherein the ion implantation process comprises implanting ions of a gaseous species.

5. The method of claim 4, wherein the ions are ions of a noble gas.

6. The method of claim 3, wherein the ion implantation process comprises implanting ions selected from group IV of the periodic table.

7. The method of claim 1, wherein the doped portion is formed in a semiconductor carrier.

8. The method of claim 7, wherein forming an amorphous portion is performed in such a manner so that a monocrystalline portion remains at an interface between the doped portion and the semiconductor carrier.

9. An integrated circuit comprising a transistor, including:
   a first and a second source/drain portion;
   a channel region disposed between the first and the second source/drain portion, the channel region being disposed in a semiconductor substrate,
   wherein at least one of the first and the second source/drain portions comprises an amorphous portion.

10. The integrated circuit of claim 9, wherein the at least one of the first and the second source/drain portions further comprises a monocrystalline portion.

11. The integrated circuit of claim 10, wherein the monocrystalline portion is disposed at an interface between the corresponding source/drain portion and a substrate portion.

12. The integrated circuit of claim 11, wherein the interface comprises a first portion extending parallel to a main surface of the semiconductor substrate, the monocrystalline portion being disposed at the first portion of the interface.

13. The integrated circuit of claim 11, wherein the interface comprises a second portion extending in a direction that intersects a main surface of the semiconductor substrate, the monocrystalline portion being disposed at the second portion of the interface.

14. The integrated circuit of claim 9, further comprising a contact structure comprising a conductive material, the contact structure being in contact with a corresponding amorphous portion.

15. The integrated circuit of claim 14, wherein the contact structure comprises a metal silicide that is in contact with the amorphous portion.

16. An integrated circuit comprising:
 a doped semiconductor portion including an amorphous portion; and
 a contact structure comprising a conductive material, the contact structure being in contact with the amorphous portion.

17. The integrated circuit of claim 16, wherein the contact structure comprises a metal silicide that is in contact with the amorphous portion.

18. The integrated circuit of claim 16, wherein the doped portion further comprises a monocrystalline portion.

19. The integrated circuit of claim 16, wherein the doped semiconductor portion forms part of a semiconductor carrier.

20. The integrated circuit of claim 19, wherein the monocrystalline portion is disposed at an interface between the doped portion and the semiconductor carrier.

* * * * *